United States Patent [19]
Sekiguchi et al.

[11] Patent Number: 5,952,715
[45] Date of Patent: Sep. 14, 1999

[54] CHIP TYPE ELECTRONIC PART

[75] Inventors: Yoshinori Sekiguchi; Munekazu Aoki, both of Tokyo, Japan

[73] Assignee: NEC Corporation, Tokyo, Japan

[21] Appl. No.: 08/974,347

[22] Filed: Nov. 19, 1997

[30] Foreign Application Priority Data

Nov. 19, 1996 [JP] Japan ..................................... 8-308484

[51] Int. Cl.$^6$ .......................... H01L 23/495; H01L 23/48; H01L 23/52

[52] U.S. Cl. .......................... 257/696; 257/693; 257/666; 257/690; 257/692

[58] Field of Search ..................................... 257/696, 693, 257/666, 678, 690, 692

[56] References Cited

U.S. PATENT DOCUMENTS

| | | | |
|---|---|---|---|
| 4,574,297 | 3/1986 | Ooi | 257/696 |
| 4,945,398 | 7/1990 | Kurita et al. | 257/696 |
| 5,446,623 | 8/1995 | Kanetake | 257/696 |
| 5,459,641 | 10/1995 | Kuriyama | 257/696 |

FOREIGN PATENT DOCUMENTS 90 18016  10/1990  Japan.

*Primary Examiner*—Valencia Martin-Wallace
*Assistant Examiner*—Jhihan B Clark
*Attorney, Agent, or Firm*—Sughrue, Mion, Zinn Macpeak & Seas, PLLC

[57]  ABSTRACT

A chip type electronic part of the present invention includes tapered notches rising from the bottom of the body of a molding. With this configuration, the electronic part achieves a high volume efficiency and a great bonding strength to a circuit board after soldering.

2 Claims, 6 Drawing Sheets

TAPERED SURFACE OF 1ST EMBODIMENT
TAPERED SURFACE OF 2ND EMBODIMENT
CONVENTIONAL TAPERED SURFACE

CHIP TYPE ELECTRONIC PART

BACKGROUND OF THE INVENTION

The present invention relates to a chip type electronic part and, more particularly, to the configuration of the bottom of the body of a molding included in a chip type electronic part.

A chip type solid-state electrolytic capacitor, for example, belongs to a family of electronic parts of the type described. For example, Journal of Technical Disclosure, No. 90-180:6, issued Oct. 20, 1990, teaches a chip type solid-state electrolytic capacitor including an anode terminal, a cathode terminal, and an upright standoff intervening between the two terminals on the bottom of the body of the product. Tapered notches extend from the upper edges of the standoff. The standoff is extended along the sides of the product except for surfaces where terminals are drawn out.

The conventional chip type solid-state electrolytic capacitor has the following problems left unsolved.

(1) A cathode layer formed on a capacitor element is apt to show itself in the vicinity of the upper edges of the standoff for the following reasons. Today, the capacitor element is increasing in size in parallel with the increasing size and capacity of a capacity of the type concerned. Further, when the capacitor element is covered with a resin in its bent position, it is difficult for the resin to turn round in the vicinity of the upper edges of the standoff due to the structure of the capacitor.

(2) The bonding strength of the capacitor to a circuit board at the time of soldering is apt to be short because the extended standoff obstructs solder and reduces the amount of solder that can reach the terminals.

SUMMARY OF THE INVENTION

It is therefore an object of the present invention to provide a chip type electronic part capable of achieving a high volume efficiency and a great bonding strength to a circuit board after soldering.

A chip type electronic part of the present invention has a body, two terminals drawn out from the body and facing each other, a standoff protruding from a mounting surface, and tapered notches each rising from the bottom of the standoff.

BRIEF DESCRIPTION OF THE DRAWINGS

The above and other objects, features and advantages of the present invention will become apparent from the following detailed description taken with the accompanying drawings in which.

Figure 1A:
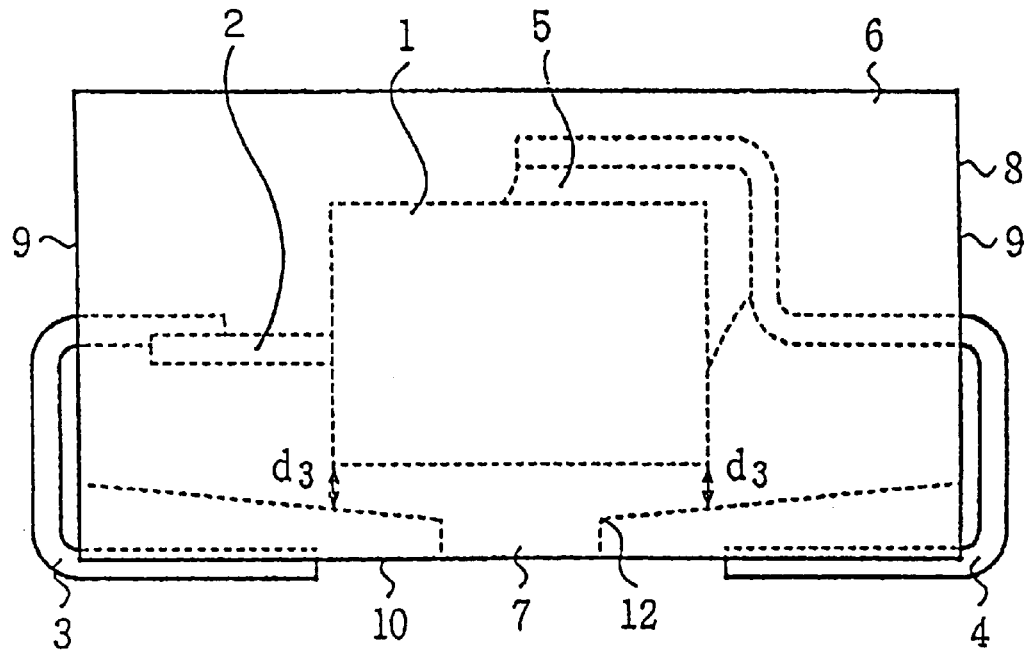
FIGS. 1A and 1B are respectively a side elevation and a bottom view showing a conventional chip type electronic part.

In the drawings, identical references denote identical structural elements.

DESCRIPTION OF THE PREFERRED EMBODIMENTS

Figure 1B:
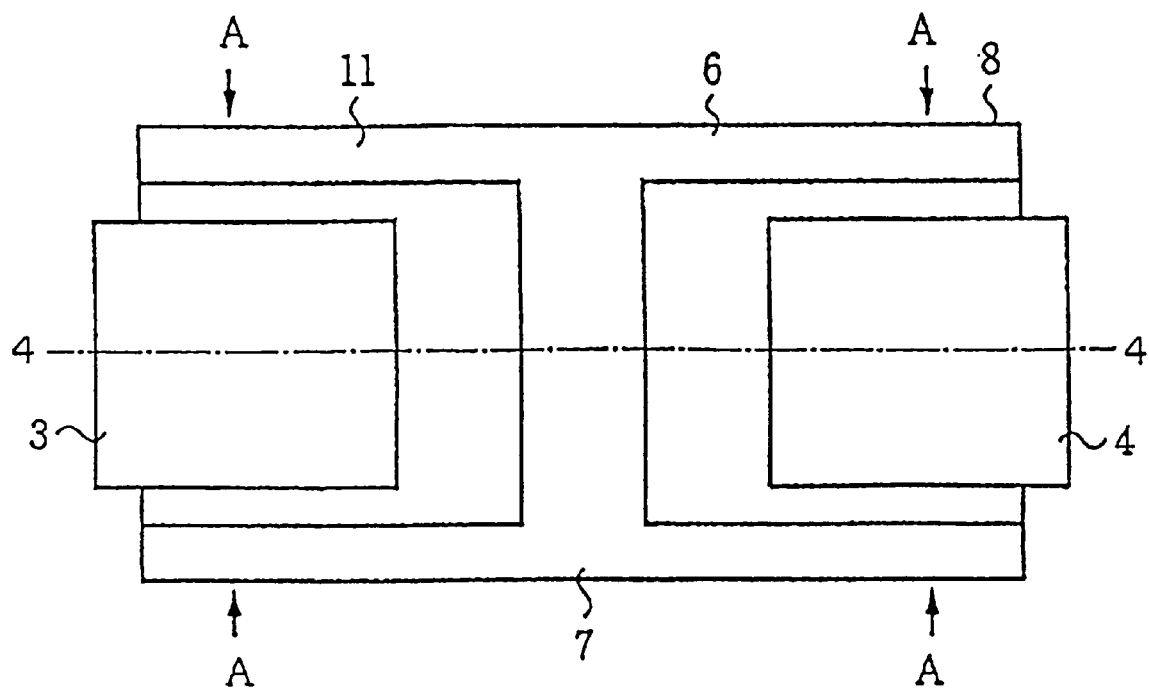

To better understand the present invention, brief reference will be made to a conventional chip type electronic part, shown in FIGS. 1A and 1B. The electronic part is implemented as a solid-state electrolytic capacitor by way of example. Generally, this type of capacitor is formed of tantalum. First, a tantalum wire is implanted in tantalum powder having a valve function and then subjected to compression molding and vacuum sintering. After a dielectric oxide film has been formed on the sintered body, a semiconductor layer implemented by, e.g., $MnO_2$ and a conductor layer are sequentially formed on the oxide film, completing a capacitor element 1. The tantalum wire plays the role of an anode lead 2. Subsequently, a cathode terminal 4 is connected to the capacitor element 1 by, e.g., a conductive adhesive 5 while an anode terminal 3 is welded or otherwise connected to the anode lead 2. Then, the capacitor element 1, including the connecting portions of the cathode terminal 4 and anode terminal 3, and the anode lead 2 are covered with a resin 6. The portions of the cathode terminal 4 and anode terminal 3 protruding from the resin 6 are bent in the form of a letter L along the sides 9 and bottom 10 of the resin 6. As a result, a chip type solid-state electrolytic capacitor is produced. In FIGS. 1A and 1B, the reference numeral 8 designates the body of the capacitor.

An upright standoff 7 intervenes between the anode terminal 3 and the cathode terminal 4 and between the terminals 3 and 4 on the bottom 10 of the product. Tapered notches extend from the upper edges 12 of the standoff 7. The standoff 7 is extended along the sides of the product except for the surfaces where the terminals are drawn out, forming an extended standoff 11. The corners of the capacitor element 1 are spaced from the tapered surfaces by a distance of $d_3$.

The capacitor having the above configuration is not desirable for the reasons discussed earlier.

Figure 2A:
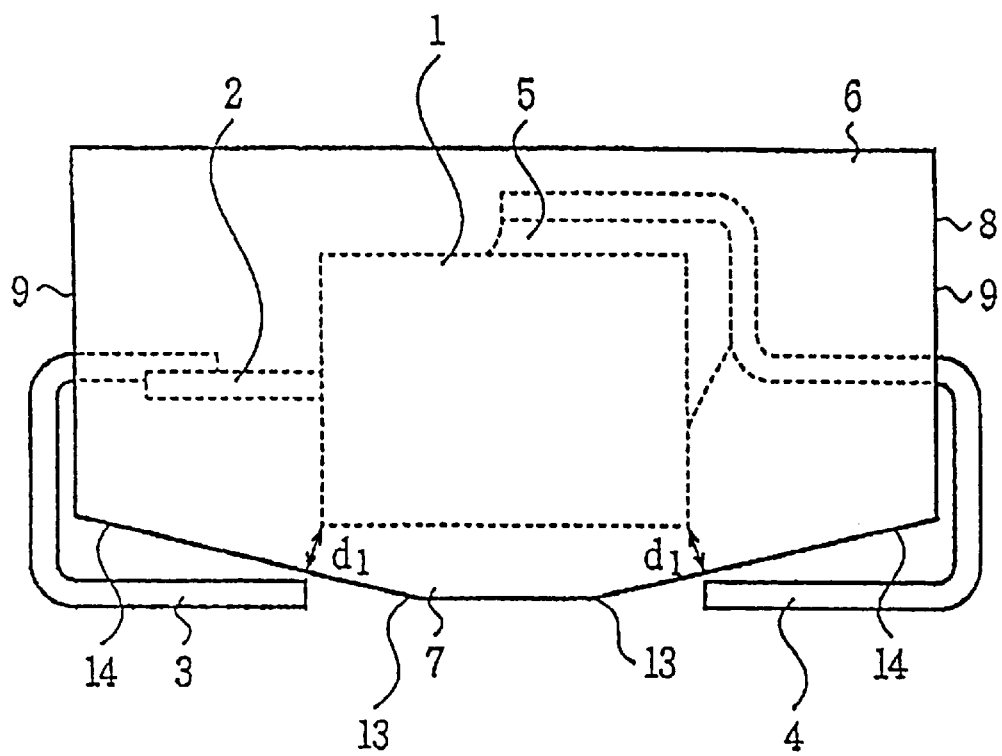
FIGS. 2A and 2B are respectively a side elevation and a bottom view showing a first embodiment of the chip type electronic part in accordance with the present invention.
Figure 2B:
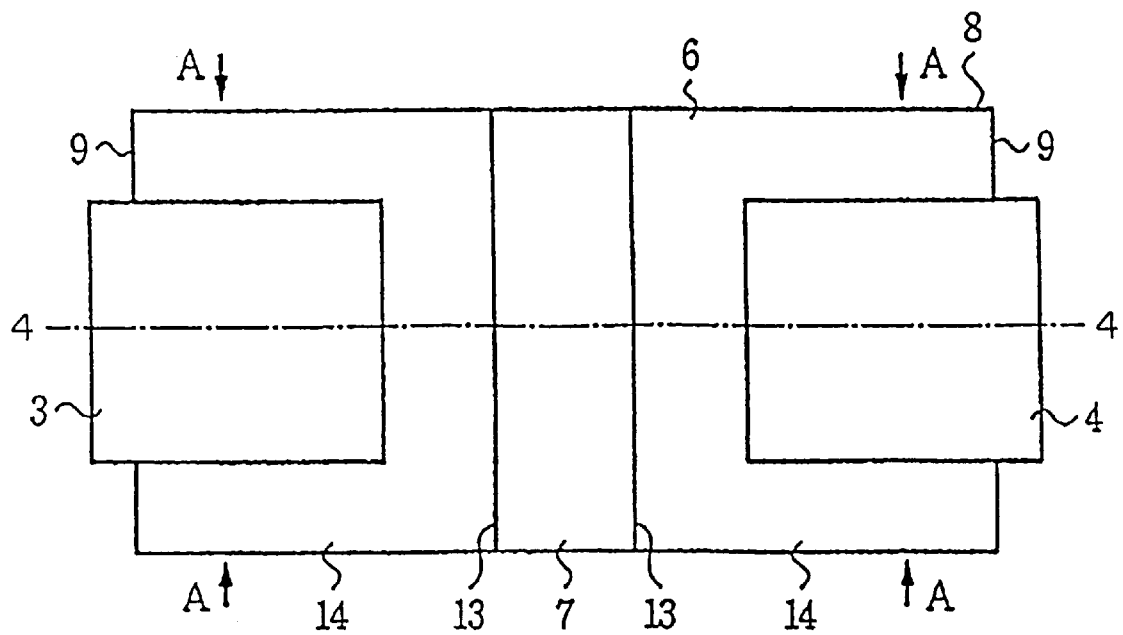

Referring to FIGS. 2A and 2B, a first embodiment of the chip type electronic part in accordance with the present invention is shown and also implemented as a solid-state electrolytic capacitor. As shown, the capacitor includes a capacitor element 1. The capacitor element 1 is made up of an anode formed of tantalum or similar metal having a valve function, and a dielectric film, $MnO_2$ or similar semiconductor layer and graphite, silver paste or similar cathode layer sequentially formed on the anode. An anode lead 2 is implemented by a wire formed of metal having a valve function, and implanted or welded to the anode when the anode is formed. The anode lead 2 is welded to an anode terminal 3. The capacitor element 1 is connected to a cathode terminal 4 by a conductive adhesive 5 made of silver by way of example. Subsequently, the entire periphery of the capacitor element 1, a part of the anode terminal 3 and a part of the cathode terminal 4 are molded by use of a resin 6.

During molding, a standoff 7 is provided on the bottom of the body of the capacitor 1 in parallel with a circuit board surface. At the same time, tapered surfaces 14 are formed which rise from the edges 13 of the standoff 7 toward the outer side surfaces 9 where the anode terminal 3 and cathode terminal 4 are respectively drawn out. Usually, the tapered surfaces 14 should preferably be inclined by 10° to 30° relative to the horizontal. Assume that the distance between the corners of the capacitor element 1 and the tapered surfaces 14, i.e., the thickness of the mold resin is $d_1$.

Figure 3A:
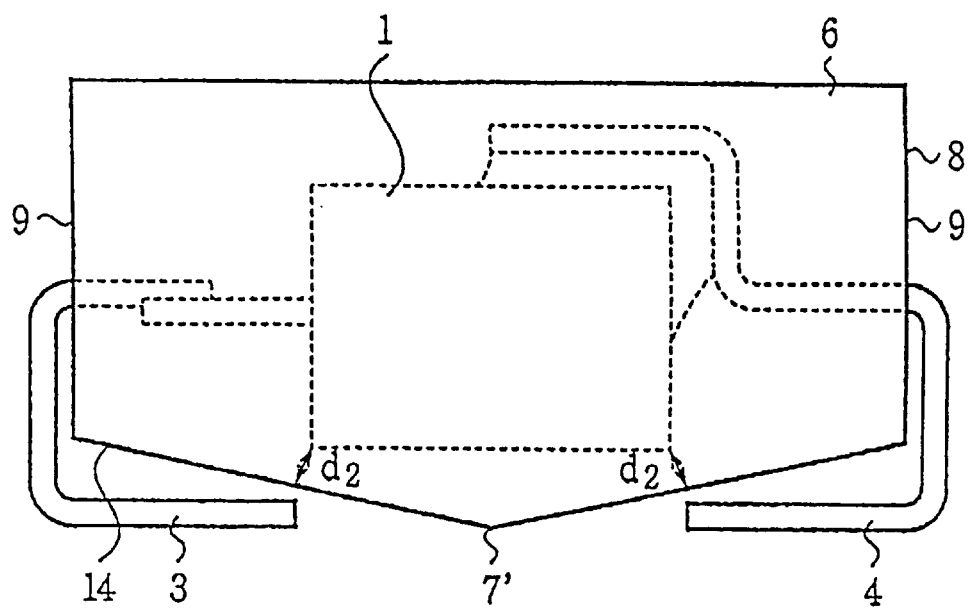
FIGS. 3A and 3B are respectively a side elevation and a bottom view showing a second embodiment of the present invention.
Figure 3B:
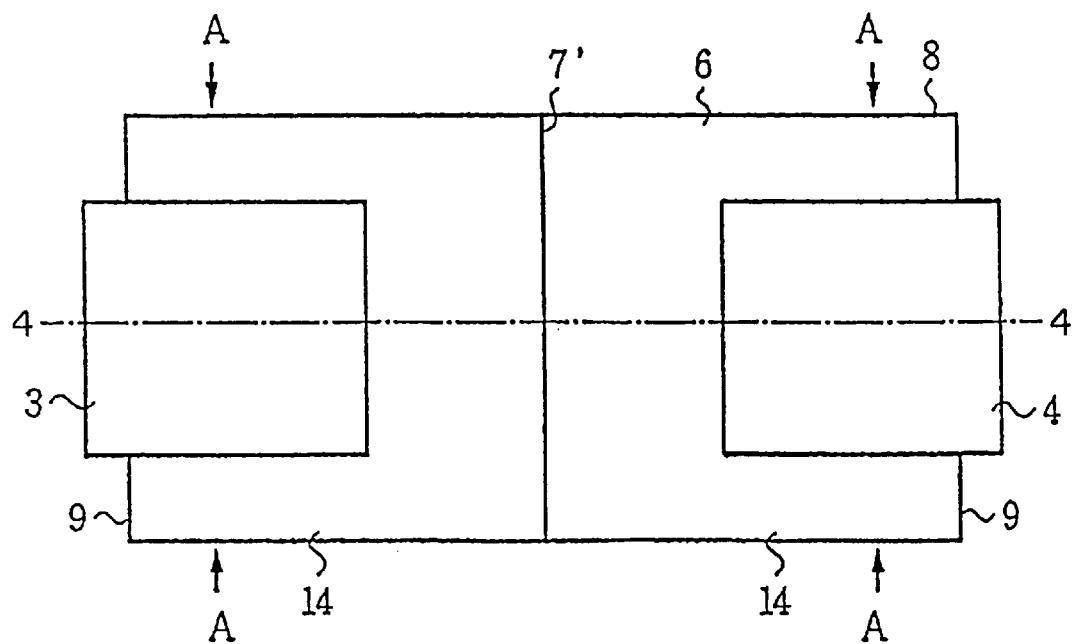

FIGS. 3A and 3B show a second embodiment of the present invention. As shown, this embodiment also includes the mold resin 6 covering the capacitor assembly. However, this embodiment is not formed with the standoff 7 parallel to a circuit board surface on the bottom of the body. The standoff 7 is replaced with a standoff 7' extending in the form of a single line. The tapered surfaces 14 extend from the common standoff 7' to the outer sides 9 where the anode terminal 3 and cathode terminal 4 are respectively drawn out. Usually, the tapered surfaces 14 should preferably be inclined by an angle equal to or smaller than the angle of the first embodiment, e.g., 5° to 30° relative to the horizontal. Assume that the distance between the corners of the capacitor element 1 and the tapered surfaces 14 is $d_1$.

Figure 4A:
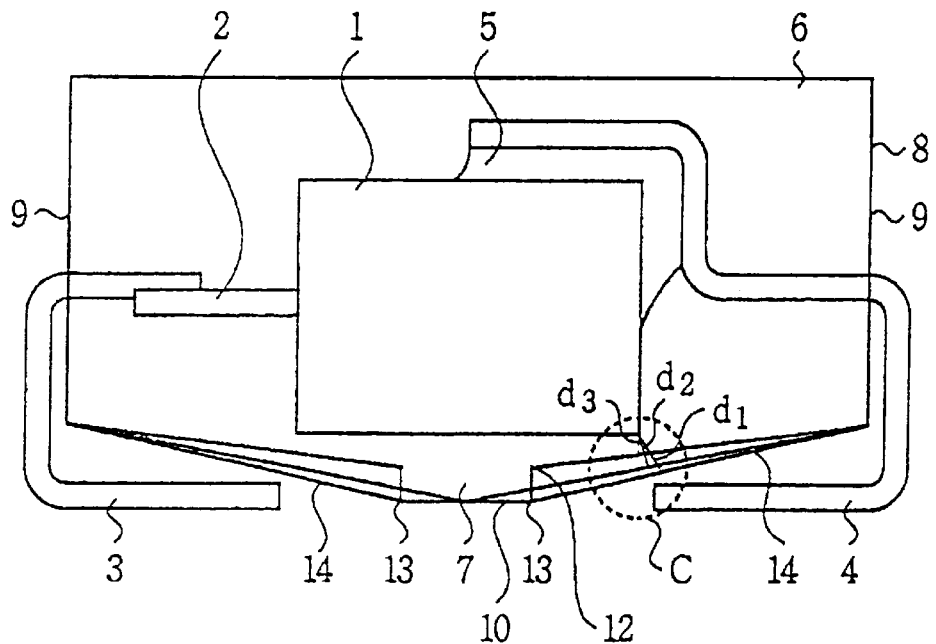
FIG. 4A is a section comparing the first and second embodiments and the conventional configuration.
Figure 4B:
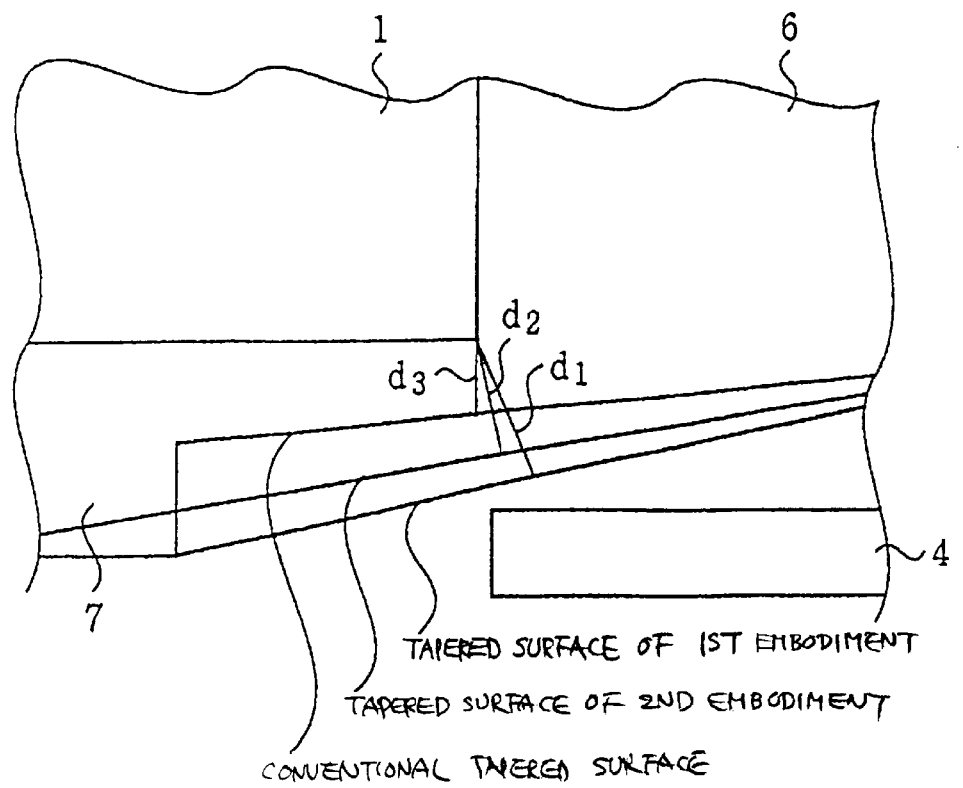
FIG. 4B is a fragmentary enlarged section showing a part of FIG. 4A.

FIGS. 4A and 4B compare the first and second embodiments of the present invention and the conventional capacitor. Specifically, FIG. 4A is the superposition of sections along lines 4—4 of FIGS. 1B, 2B and 3B while FIG. 4B is an enlarged view showing the thick mold portion intervening between the capacitor 1 and the body 8 of the molding shown in FIG. 4A. As shown in FIG. 4B, the distance between the capacitor element 1 and the tapered surfaces of the mold resin 6, i.e., the thickness of the mold resin is greater in the first embodiment than in the second embodiment and greater in the second embodiment than in the conventional configuration. The greater distance allows a greater capacitor element to be accommodated in the molding without being exposed to the outside.

Figure 5:
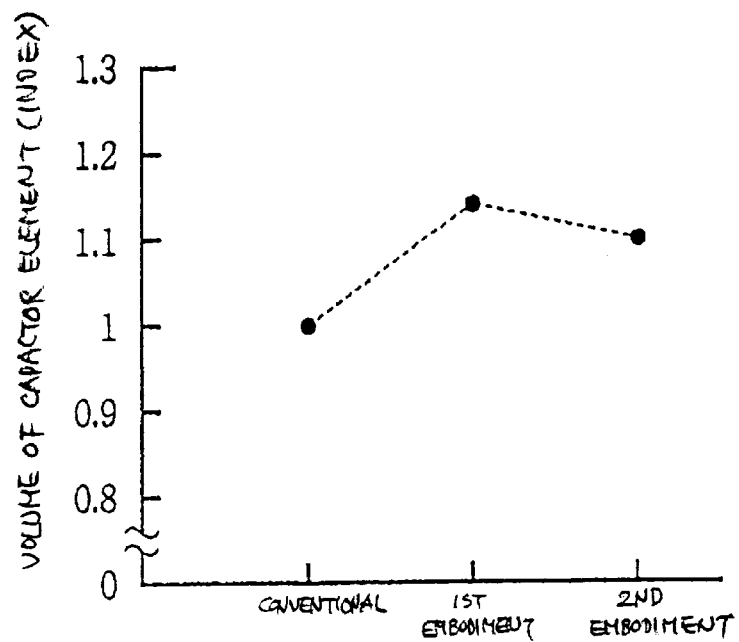
FIG. 5 compare the first and second embodiments and conventional configuration with respect to the volume of an element to be accommodated.
Figure 6:
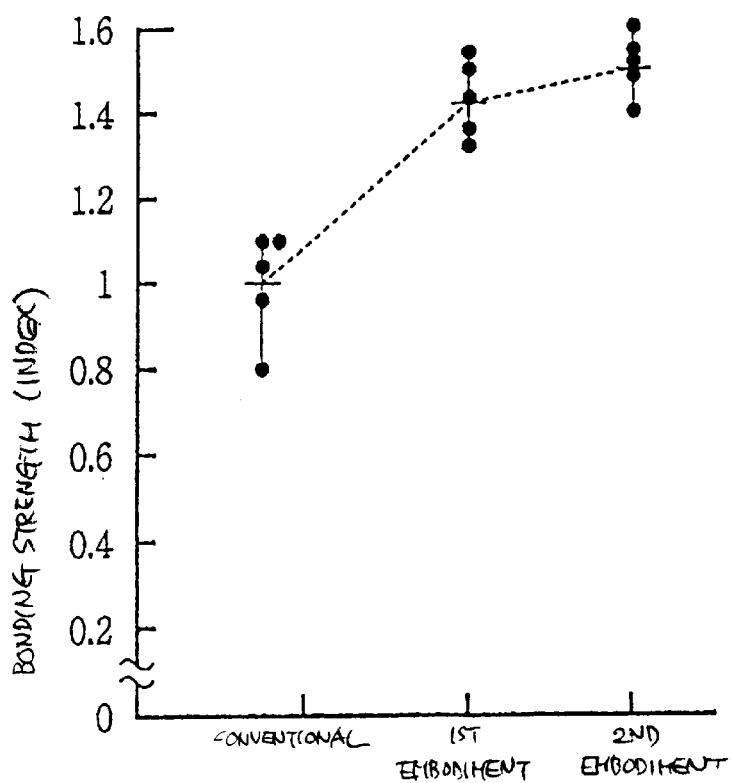
FIG. 6 compare the first and second embodiments and conventional configuration with respect to the bonding strength after soldering.

FIG. 5 compares the first and second embodiments and the conventional capacitor with respect to the volume of a capacitor element which can be accommodated in the molding. FIG. 6 compares them with respect to a bonding strength after soldering measured by pushing each of them sideways by use of a push-pull gauge. It is to be noted that FIGS. 5 and 6 give a numerical value of 1 to the conventional capacitor and give relative numerical values to the first and second embodiments.

As shown in FIGS. 4A and 4B, the mold thickness between the capacitor element 1 and the molding body 8 can be made greater in the first embodiment than in the second embodiment and greater in the second embodiment than in the conventional capacitor. As a result, the volume of a capacitor which can be accommodated in the molding increases in the above order.

The first and second embodiments do not include the extended standoff 11 shown in FIGS. 1A and 1B. Therefore, when the capacitor of the first or second embodiment is soldered to a circuit board, a greater amount of solder can turn round to the anode terminal 3 and cathode terminal 4 in directions A shown in FIG. 2B or 3B than in the directions A shown in FIG. 1B. Therefore, the embodiments achieve a greater bonding strength after soldering than the conventional capacitor, as shown in FIG. 6.

As shown in FIGS. 4A and 4B, the second embodiment is smaller than the first embodiment in the mold thickness between the capacitor element 1 and the bottom of the molding body 8. This, however, increases the space between the tapered surfaces 14 and the anode terminal 3 and cathode terminal 4 and thereby increases the amount of solder that can turn round to the terminals 3 and 4. As a result, the second embodiment achieves a slightly greater bonding strength after soldering than the first embodiment.

Figure 7A:
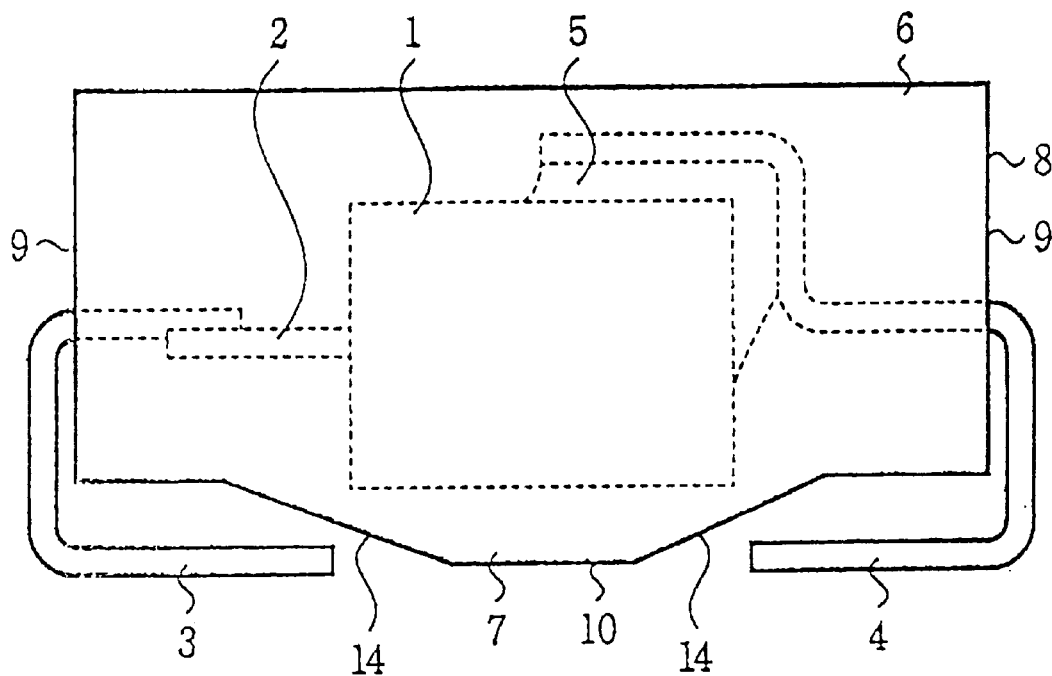
FIGS. 7A and 7B are respectively a side elevation and a bottom view showing a third embodiment of the present invention.
Figure 7B:
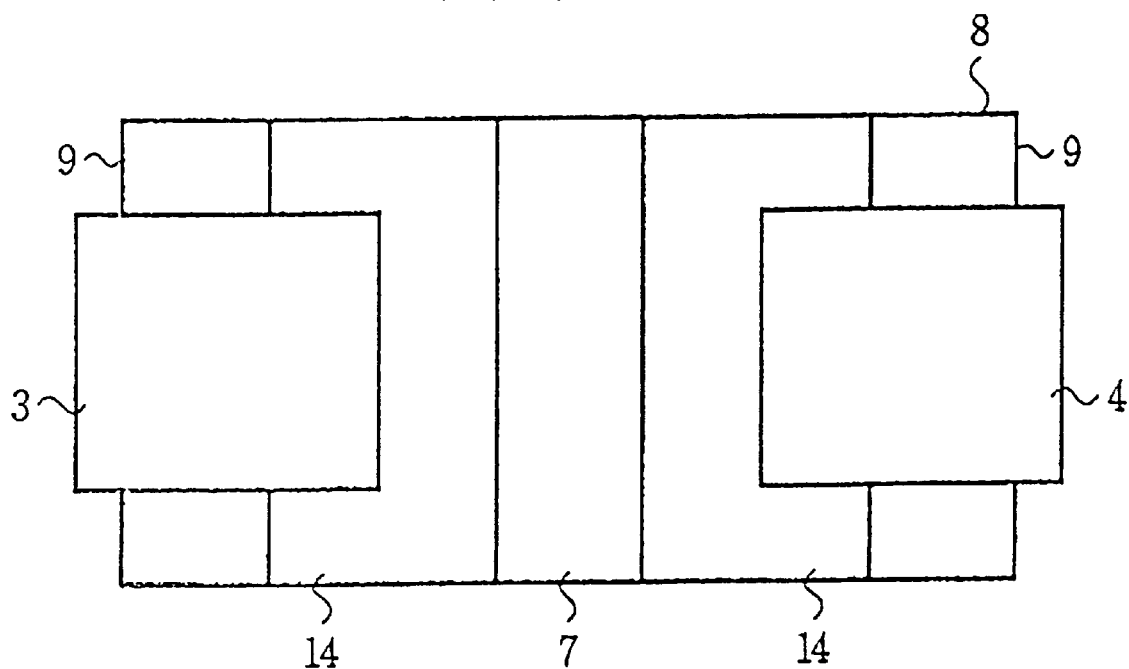

FIGS. 7A and 7B show a third embodiment of the present invention. As shown, the tapered surfaces 14 rising from the bottom of the standoff 7 terminate before reaching the sides of the molding body 8 where the anode terminal 3 and cathode terminal 4 are drawn out. The tapered surfaces 14 are bent on the bottom of the molding body 8. This configuration also enhances the volume efficiency and bonding strength of a chip type solid-state electrolytic capacitor.

While the illustrative embodiments have concentrated on a chip type solid-state electrolytic capacitor, they are, of course, applicable to any other chip type electronic part, e.g., a chip type resistor or a chip type inductor.

In summary, a chip type electronic part of the present invention achieves a high volume efficiency. Therefore, a greater capacitor element, resistor element or similar electronic element can be accommodated in the conventional dimensions, enhancing a miniature, large capacity configuration. This is because a mold thickness between the electronic part and the bottom of a molding body is increased.

Also, the electronic part of the present invention can be soldered to a circuit board with a greater bonding strength. Specifically, a greater space is available between the bottom of the molding body and terminals, allowing a greater amount of solder to turn round to the terminals at the time of soldering.

Various modifications will become possible for those skilled in the art after receiving the teachings of the present disclosure without departing from the scope thereof.

What is claimed is:

1. A chip type electronic part comprising:

a body having a bottom with two tapered surfaces that taper toward a standoff; and two terminals projecting from said body and facing each other;

wherein said standoff is a flat surface, and wherein said two tapered surfaces are inclined with respect to said standoff at an angle in the range of 10°–30°.

2. A chip type electronic part comprising:

a body having a bottom with two tapered surfaces that taper toward a standoff; and two terminals projecting from said body and facing each other;

wherein said standoff is a straight line, and wherein said two tapered surfaces are inclined with respect to a plane containing said stand off at an angle in the range of 5°–30°.

* * * * *